(12) United States Patent
Ohkubo et al.

(10) Patent No.: US 8,085,384 B2
(45) Date of Patent: Dec. 27, 2011

(54) EXPOSURE APPARATUS

(75) Inventors: Akinori Ohkubo, Utsunomiya (JP);
Akiyoshi Suzuki, Meguro-ku (JP)

(73) Assignee: Canon Kabushiki Kaisha (JP)

( * ) Notice: Subject to any disclaimer, the term of this patent is extended or adjusted under 35 U.S.C. 154(b) by 655 days.

(21) Appl. No.: 11/742,042

(22) Filed: Apr. 30, 2007

(65) Prior Publication Data
US 2007/0252968 A1 Nov. 1, 2007

(30) Foreign Application Priority Data
May 1, 2006 (JP) .................. 2006-127773

(51) Int. Cl.
G02B 27/10 (2006.01)
G03B 27/32 (2006.01)
G03B 27/42 (2006.01)
G03B 27/54 (2006.01)
G03B 27/72 (2006.01)

(52) U.S. Cl. ............... 355/71; 355/53; 355/67; 355/77; 359/619

(58) Field of Classification Search ............ 355/53, 355/67, 71, 77; 359/562, 619, 621, 623, 359/626, 628
See application file for complete search history.

(56) References Cited

U.S. PATENT DOCUMENTS

| 5,242,770 A | 9/1993 | Chen et al. |
| 5,621,499 A * | 4/1997 | Shiozawa ................ 355/67 |
| 6,049,374 A * | 4/2000 | Komatsuda et al. ......... 355/67 |
| 6,096,461 A | 8/2000 | Gelbart |
| 6,107,011 A | 8/2000 | Gelbart |
| 6,628,730 B1 | 9/2003 | Stott et al. |
| 6,855,486 B1 * | 2/2005 | Finders et al. ............. 430/394 |
| 2001/0024372 A1 * | 9/2001 | Hamanaka et al. ......... 362/554 |
| 2002/0005940 A1 * | 1/2002 | Hatada et al. .............. 355/55 |
| 2002/0008863 A1 * | 1/2002 | Taniguchi et al. .......... 355/55 |
| 2002/0167653 A1 * | 11/2002 | Mulkens et al. ........... 355/67 |
| 2003/0035089 A1 * | 2/2003 | Chandhok et al. .......... 355/53 |
| 2003/0156269 A1 * | 8/2003 | Komatsuda et al. ........ 355/71 |
| 2004/0057033 A1 * | 3/2004 | McCullough et al. ...... 355/53 |
| 2005/0012916 A1 * | 1/2005 | Van Der Mast et al. .... 355/67 |

FOREIGN PATENT DOCUMENTS
JP 2000-228358 8/2000
* cited by examiner

Primary Examiner — Hung Henry Nguyen
Assistant Examiner — Colin Kreutzer
(74) Attorney, Agent, or Firm — Rossi, Kimms & McDowell LLP

(57) ABSTRACT

An exposure apparatus that exposes a pattern of an original onto a substrate includes a condenser optical system configured to split light from a light source into plural rays, to condense the plural rays at different positions on the original, and to make a central part of each of the plural rays that illuminate the original darker than a periphery at the Fourier transform plane with respect to the original, and a projection optical system configured to project the pattern of the original onto the substrate.

6 Claims, 11 Drawing Sheets

1A

1B

EXPOSURE APPARATUS

BACKGROUND OF THE INVENTION

1. Field of the Invention

The present invention relates to an exposure apparatus.

2. Description of the Related Art

A conventional projection exposure apparatus projects a circuit pattern of a reticle (mask) onto a wafer or another substrate via a projection optical system in manufacturing fine semiconductor devices, such as a semiconductor memory and a logic circuit, using the photolithography technology.

The minimum size or a resolution transferable by the projection exposure apparatus is proportionate to a wavelength of the light used for exposure, and inversely proportionate to a numerical aperture ("NA") of the projection optical system. The shorter the wavelength is and the higher the NA becomes, the smaller the resolution is. The resolution R of the projection exposure apparatus can be given by Equation 1 below where is a wavelength of a light source, NA is a numerical aperture of the projection optical system, and k1 is a constant determined by an optical system, a reticle, and a process:

$$R = k1 \times \lambda / NA \qquad \text{Equation 1}$$

Along with the recent demands for fine processing to a semiconductor device, use of a shorter wavelength of the exposure light is promoted. For example, use of a shorter wavelength of the ultraviolet is promoted from a KrF excimer laser with a wavelength of about 248 nm to an ArF excimer laser with a wavelength of about 193 nm. The NA of the projection optical system becomes higher with the immersion lithography that provides a NA above a theoretical limit in air of 1. The k1 factor reduces as a reticle structure, an illumination condition, and a process condition are optimized. However, as the k1 factor reduces, a reticle pattern is not precisely transferred or reproduced on a wafer due to the optical proximity effect ("OPE").

Accordingly, it is proposed to add an optical proximity correction ("OPC") pattern to a reticle pattern on a reticle. A more sophisticated OPC pattern has also recently been proposed that takes care of a process model in addition to the OPE correction.

Some other technologies that correct the OPE are proposed. See Japanese Patent Laid-Open No. 2000-228358. Japanese Patent Laid-Open No. 2000-228358 arranges a lens array just above a reticle, divides a reticle pattern into plural reticles so that a imaged pattern is not subject to the OPE, illuminates the reticle with spotted rays from the lens array, and performs plural exposures.

Nevertheless, prior art cannot resolve a fine pattern with a good contrast while maintaining the semiconductor manufacturing cost. For example, the sophisticated OPC pattern complicates the reticle pattern, increasing the reticle data. Hence, it takes a long time to manufacture and inspect the reticle, and the manufactured reticle pattern contains more errors and defects, remarkably increasing the reticle cost, and the semiconductor manufacturing cost.

Japanese Patent Laid-Open No. 2000-228358 needs a reticle with no OPC pattern, and can avoid an increased semiconductor manufacturing cost due to the OPC pattern, but plural exposures with different reticles still increase the semiconductor manufacturing cost.

BRIEF SUMMARY OF THE INVENTION

The present invention is directed to an exposure apparatus that can resolve a fine pattern without increasing the semiconductor manufacturing cost.

An exposure apparatus according to one aspect of the present invention that exposes a pattern of an original onto a substrate includes a condenser optical system configured to split light from a light source into plural rays, to condense the plural rays at different positions on the original, and to make a central part of each of the plural rays that illuminate the original darker than a periphery at the Fourier transform plane with respect to the original, and a projection optical system configured to project the pattern of the original onto the substrate.

Further features of the present invention will become apparent from the following description of exemplary embodiments with reference to the attached drawings.

BRIEF DESCRIPTION OF THE DRAWINGS

FIG. 4A shows a numerical analysis result of an intensity distribution of an aerial image having a k1 factor of about 0.42 on a wafer in the conventional exposure apparatus.

DESCRIPTION OF THE EMBODIMENTS

Figure 1:
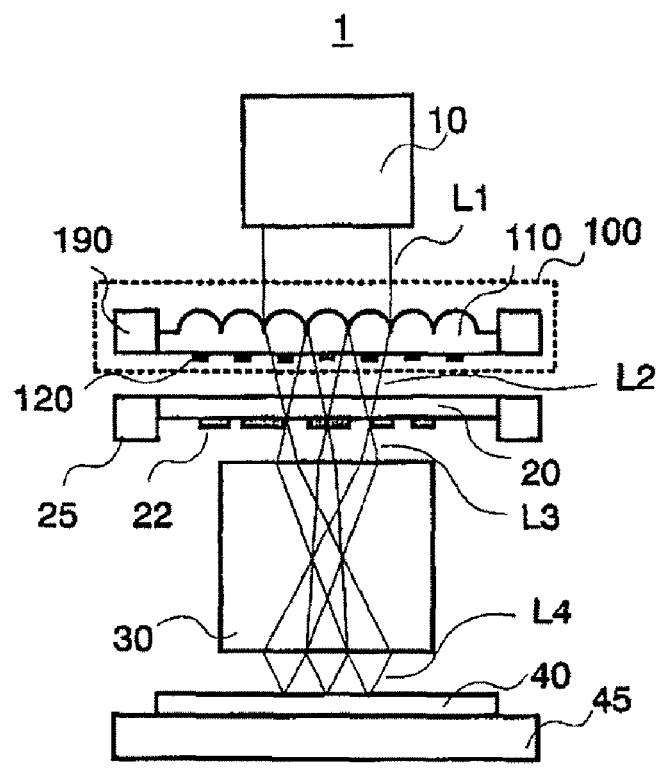
FIG. 1 is a schematic sectional view showing a structure of an exposure apparatus according to one aspect of the present invention.

Referring now to the accompanying drawings, a description will be given of an exposure apparatus according to one aspect of the present invention. In each figure, the same reference numeral designates the same element, and a duplicate description thereof will be omitted. Here, FIG. 1 is a schematic sectional view showing a structure of an exposure apparatus 1 of this embodiment.

The exposure apparatus 1 is a projection exposure apparatus that exposes a pattern 22 of a reticle 20 as an original onto a wafer 40 as a substrate. The exposure apparatus 1 of this embodiment is a step-and-scan projection exposure apparatus, but can use a step-and-repeat manner.

The exposure apparatus 1 includes, as shown in FIG. 1, an illumination apparatus 10, a reticle stage 25 mounted with a reticle 20, a projection optical system 30, a wafer stage 45 mounted with a wafer 40, and a condenser optical system 100.

The illumination apparatus 10 illuminates the reticle 20 that has a pattern 22 to be transferred, and includes a light source (not shown), and an illumination optical system (not shown). The light source uses an ArF excimer laser having a wavelength of about 193 nm. However, the light source may use a KrF excimer laser having a wavelength of about 248 nm, and a $F_2$ laser having a wavelength of about 157 nm. The number of lasers is not limited. The illumination optical system is an optical system that introduces light L1 from the light source to the condenser optical system 100, and includes a lens, a mirror, an optical integrator, and a stop.

The reticle 20 is made of quartz, has the pattern 22 to be transferred, and is supported on and driven by the reticle stage 25.

The reticle stage 25 supports the reticle 20, and is connected to a moving mechanism (not shown).

The projection optical system 30 projects the pattern 22 of the reticle 20 onto the wafer 40. The projection optical system 30 may use a dioptric, catadioptric, or catoptric system.

This embodiment uses the wafer 40 as a photosensitive substrate, but may use a glass plate and another substrate for the substrate. A photoresist (photosensitive agent) is applied to the wafer 40.

The wafer stage 45 supports the wafer 40, and connected to a moving mechanism (not shown).

The condenser optical system 100 illuminates the reticle 20 with the light L1 from the illumination optical system 10, and includes an optical element 110, and a light attenuator 120. While this embodiment separates the condenser optical system 100 from the illumination apparatus 10, the condenser optical system 100 may constitute part of the illumination apparatus 10. The light attenuator 120 and an element arranged near the light attenuator may be equipped with a cooling mechanism, such as a water cooling mechanism and a Peltier element, which reduces the thermal influence due to the light absorption.

The optical element 110 splits the light L1 from the illumination apparatus 10 into plural rays L2. The plural rays L2 are convergent rays due to an operation of the optical elements 110. The optical element 110 condenses the plural rays L2 on different positions of the reticle 20.

The optical element 120 attenuates or shields a low frequency component in a spatial frequency (angular frequency) region of the plural rays L2 from the optical element 110. In other words, the light attenuator 120 makes a central part of each of the plural rays L2 that are emitted from the optical element 110 and illuminate the reticle 20, darker than the periphery at the Fourier transform plane with respect to the reticle 20.

A stage 190 supports and drives the condenser optical system 100 (i.e., the optical element 110 and the light attenuator 120 in this embodiment).

A description will now be given of the rays L2 whose low frequency components are shielded by the light attenuator 120. The plural rays L2 are condensed on the pattern 22 (patterned surface) of the reticle 20 supported on the reticle stage 25, and form plural spots.

The pattern 22 on the reticle 20 absorbs or phase-modulates parts of the plural rays L2. Rays L3 that have transmitted the reticle 20 among the plural rays L2 are incident upon the projection optical system 30.

The rays L3 are refracted and/or reflected in the projection optical system 30, become plural convergent rays L4, and form plural beam spots on the wafer 40. The beam spots form the pattern 22 of the reticle 20 onto a photosensitive material or thermally reactive material, such as a resist, applied to the wafer 40.

The rays L3 that are derived from the plural spots condensed by the pattern 22 of the reticle 20 have low degree of coherence, and the sum of plural beam spot intensities on the wafer 40 contributes to imaging, and restrains the OPE that would deteriorate the image fidelity.

Figure 2:
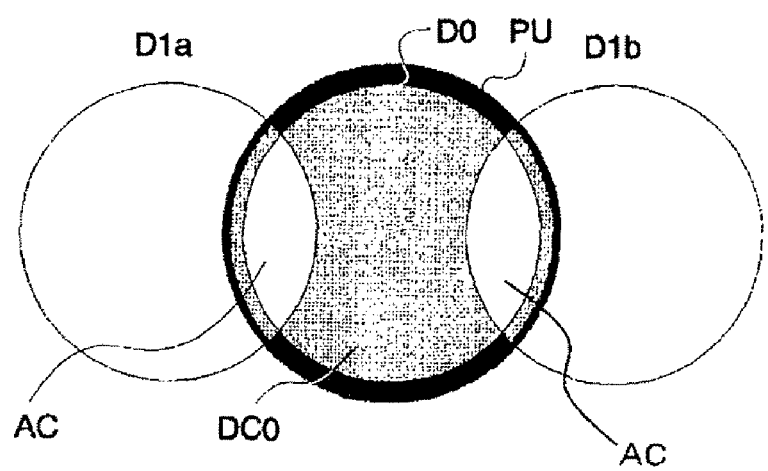
FIG. 2 shows a diffracted light distribution on a pupil plane of a projection optical system in a conventional exposure apparatus.

For example, assume that the condenser optical system 100 is applied to a repetitive pattern of a line and space. As in the above prior art, when the pattern 22 of the reticle 20 is illuminated by the light whose low frequency component is not shielded, the light intensity distribution shown in FIG. 2 is formed on the pupil plane of the projection optical system 30. In FIG. 2, PU is a pupil area of the projection optical system 30. D0 is the 0-th order diffracted light generated from the pattern 22 of the reticle 20. D1a is the −1st order diffracted light, and D1b is the +1st order diffracted light. AC is an overlapping area between the −1st order diffracted light D1a and the +1st order diffracted light D1b. DC0 is an area in which the 0-th order diffracted light D0, the −1st order diffracted light D1a, and the +1st order diffracted light D1b do not overlap one another. Referring to FIG. 2, only the area AC contributes to the intensity modulation of the pattern 22 imaged on the wafer 40. The area DC0 is a low frequency component that deteriorates the contrast of the image. Here, FIG. 2 shows the diffracted light distribution on the pupil plane of the projection optical system in the conventional exposure apparatus.

Figure 3:
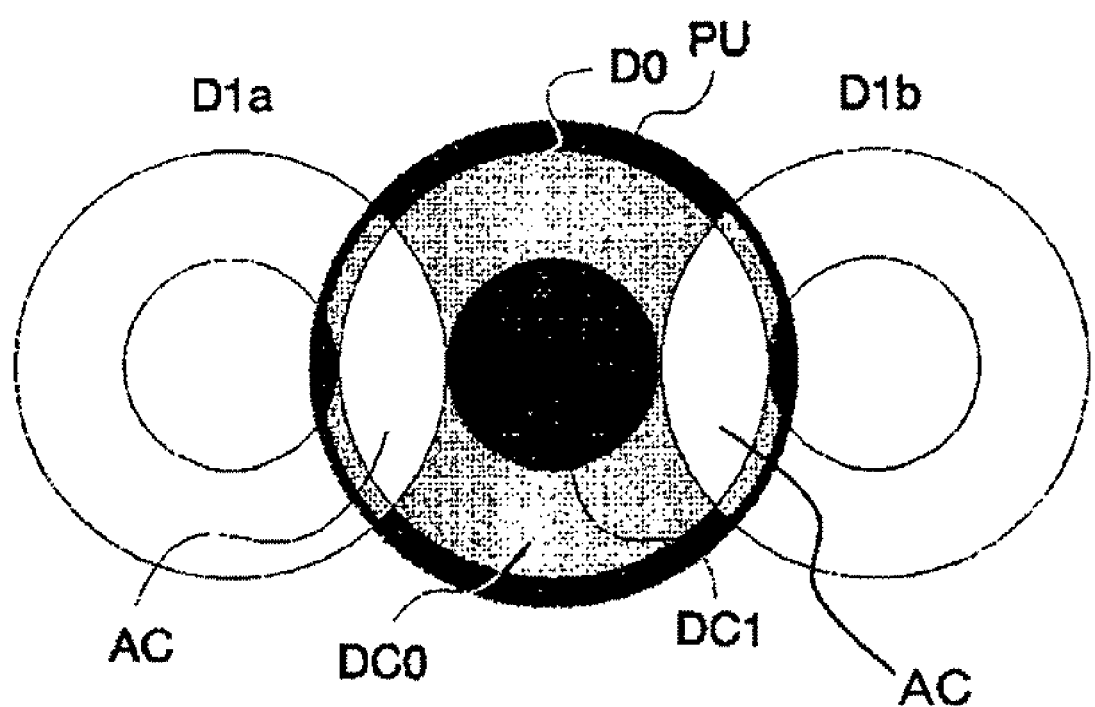
FIG. 3 shows a diffracted light distribution on a pupil plane of a projection optical system in the exposure apparatus shown in FIG. 1.

On the other hand, this embodiment uses the condenser optical system 100, shields the central part of each of the plural rays L2 that illuminate the pattern 22 of the reticle 20, and reduces the dose of the area DC1 corresponding to the light attenuator 120 in the area DC0 as shown in FIG. 3. This embodiment reduces the low frequency component that would deteriorate the contrast of the image, and provides the image with a high contrast and high fidelity (transfer accuracy). Here, FIG. 3 shows the diffracted light distribution on the pupil plane of the projection optical system 30 in the exposure apparatus 1.

The exposure apparatus 1 reduces the OPE generated in the conventional exposure apparatus, and thus an OPC pattern that would otherwise be added to the pattern 22 of the reticle 20. Moreover, in transferring an image of a small pattern size for the wavelength of the exposure light, the exposure apparatus 1 does not require a complicated OPC pattern to be added to a circuit pattern having a small k1 factor on a reticle, maintaining the manufacturing cost and the yield.

Assume an exposure apparatus that uses the ArF excimer laser having a wavelength of 193.368 nm. The intensity distribution of an aerial image on the wafer 40 is found through a numerical analysis. The aerial image is directed to a cross pattern that arranges a pair of bar patterns in a cross shape, each of which has a critical dimension ("CD") of 68 nm, and a length of 340 nm.

Figure 4B:
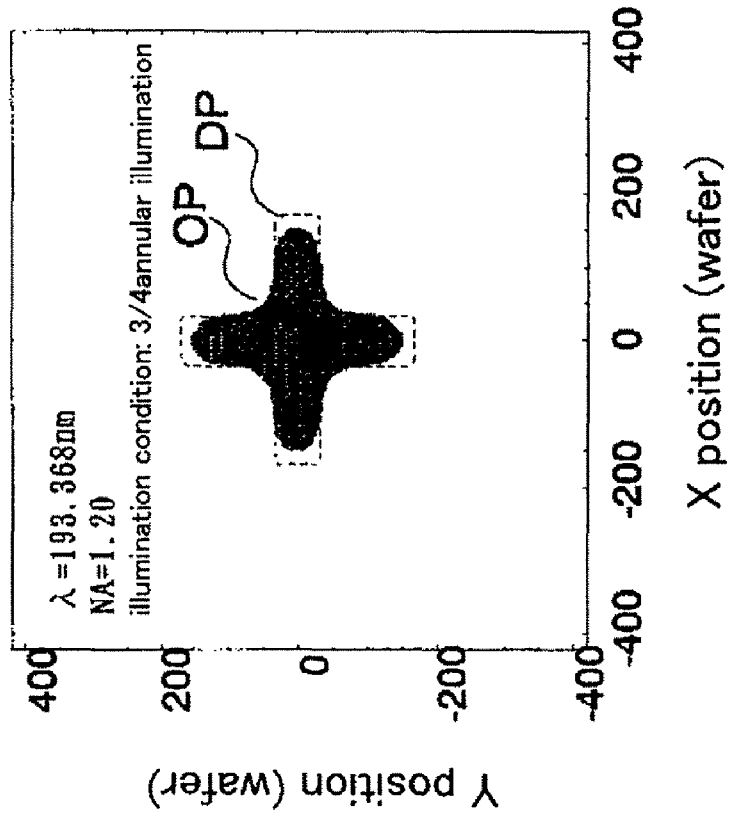
FIG. 4A shows a numerical analysis result of an intensity distribution of an aerial image having a k1 factor of about 0.3 on a wafer in the conventional exposure apparatus.
Figure 4A:
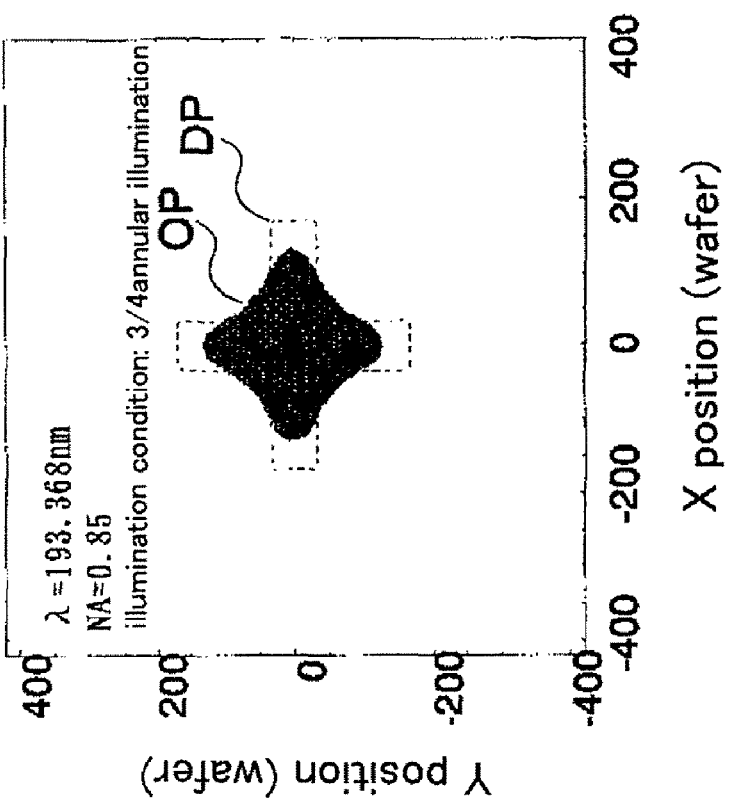

FIGS. 4A and 4B show numerical analysis results of the intensity distributions of the aerial image on the wafer in the conventional exposure apparatus. In FIGS. 4A and 4B, OP is an aerial image pattern formed on the wafer. The ordinate and abscissa axes have a unit of nanometer, and a broken line DP indicates a shape of a designed reticle pattern (i.e., a cross pattern) on the wafer. A threshold that determines the aerial image pattern OP uses a value that enables the designed reticle pattern to have the same CD at a position apart from the center of the cross pattern DP by 102 nm in both longitudinal and lateral directions.

FIG. 4A shows the intensity distribution of the aerial image on the wafer in the exposure apparatus that has a projection optical system with an NA of 0.85 under the illumination condition of the ¾ annular illumination. The k1 factor is about 0.3 from Equation 1. Referring to FIG. 4A, when the k1 factor is about 0.3, it is understood that the pattern transferred on the wafer is remarkably different from the designed reticle pattern.

FIG. 4B shows the intensity distribution of the aerial image on the wafer when the NA of the projection optical system is increased up to 1.2 so as to increase the k1 factor. In this case, the k1 factor is about 0.42. Referring to FIG. 4B, when the k1 factor is about 0.42, the cross pattern DP that is comparatively close to the designed reticle pattern is transferred onto the wafer. It is understood from these results that the conventional exposure needs an OPC pattern to improve the fidelity (transfer accuracy) of the image having the k1 factor of about 0.3.

Figure 5:
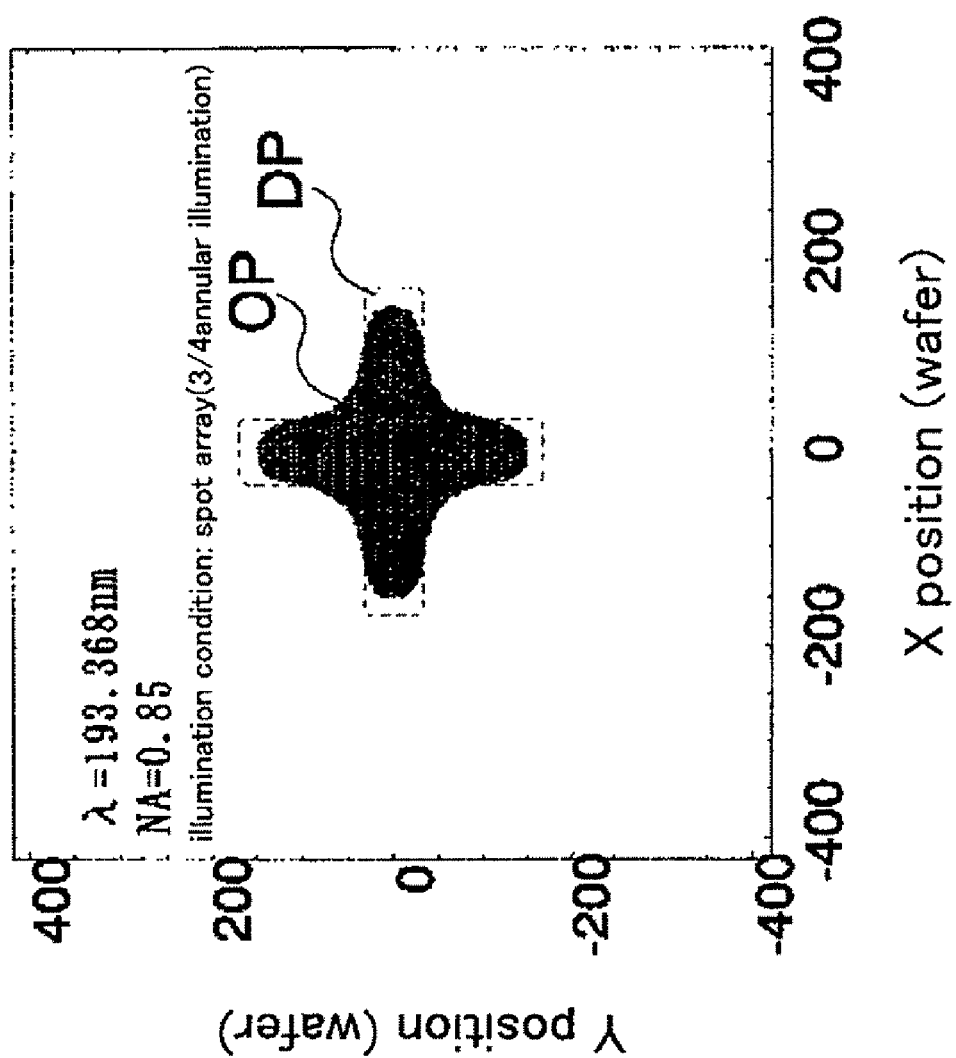
FIG. 5 shows a numerical analysis result of an intensity distribution of an aerial image on a wafer in the exposure apparatus shown in FIG. 1.

On the other hand, FIG. 5 shows the numerical analysis result of the intensity distribution of the aerial image on the wafer 40 in the exposure apparatus 1 of this embodiment. Similar to the above conventional exposure apparatus, the wavelength of the light source is =193.368 nm, the NA of the projection optical system 30 is 0.85, and the unit of the ordinate and abscissa axes have a unit of nanometer. The designed pattern 22 of the reticle 20 is the cross pattern DP similar to FIG. 4, and the k1 factor of the minimum CD corresponds to about 0.3. When the luminance distribution of the rays L2 shown in FIG. 1 is a set of the rays condensed from the ¾ annular light, the image pattern OP transferred on the wafer 40 has a shape shown in FIG. 5 for the designed cross pattern DP of the reticle 20. It is understood from FIG. 5 that a fidelity (transfer accuracy) is similar to that with the projection optical system shown in FIG. 4B having an NA of is 1.2 and the k1 factor of 0.42. Thus, the exposure apparatus 1 of this embodiment dispenses with a complex OPC pattern, which has been necessary for the conventional exposure apparatus.

A description will now be given of a concrete structure of the condenser optical system 100. The optical element 100 uses a microlens array, which may include a diffraction optical element, such as a Fresnel zone plate.

The light attenuator 120 that shields the low frequency component uses a light blocking member or film made, for instance, of metal. For example, when the optical element 110 includes a microlens array, the light blocking member as the light attenuator 120 is arranged at the center of each microlens in the microlens array. The light attenuator 120 arranges, in FIG. 1, it on the surface of the optical element 110 on the side of the reticle 20, but it may be arranged on or in the illumination apparatus 10 side of the optical element 110 or on the rear surface of the patterned surface of the reticle 20 (or on the surface at the illumination apparatus 10 side).

Figure 6:
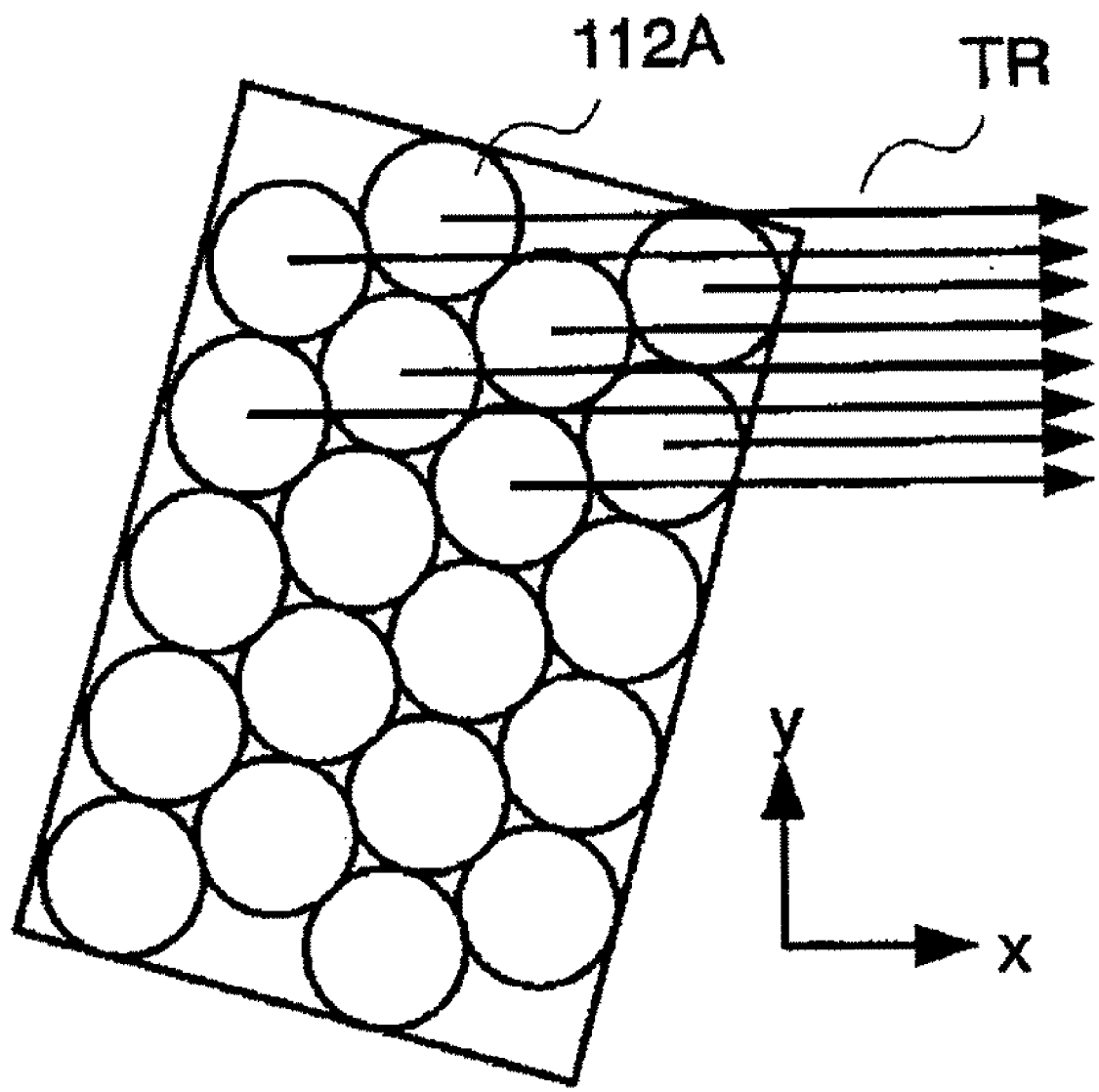
FIG. 6 shows an illustrative arrangement of a microlens array in an example of an optical element in a condenser optical system in the exposure apparatus shown in FIG. 1.

FIG. 6 shows an illustrative arrangement of a microlens array 110A in an example of the optical element 110. The microlens array 110A includes microlenses 112A spaced at regular intervals as shown in FIG. 6. Each microlens 112A condenses the rays L2 on the reticle 20, and forms a condensed spot row. Since the condensed spot row has a condensed spot interval greater than the condensed spot diameter and does not cause the interference, the degree of coherence is low. Therefore, the OPE can be reduced.

The spot on the reticle 20 is scanned along a path TR when the microlens array 110A is scanned in the x direction shown in FIG. 6 relative to the reticle 20, and the entire pattern 22 on the reticle 20 can be transferred to the wafer 40. When the arrangement direction of the microlenses 112A in the microlens array 110A is made oblique to the y direction on the xy plane, the spot interval in the y direction can be made narrower than the interval of the microlenses 112A, providing a more uniform luminance distribution in the y direction.

Figure 7:
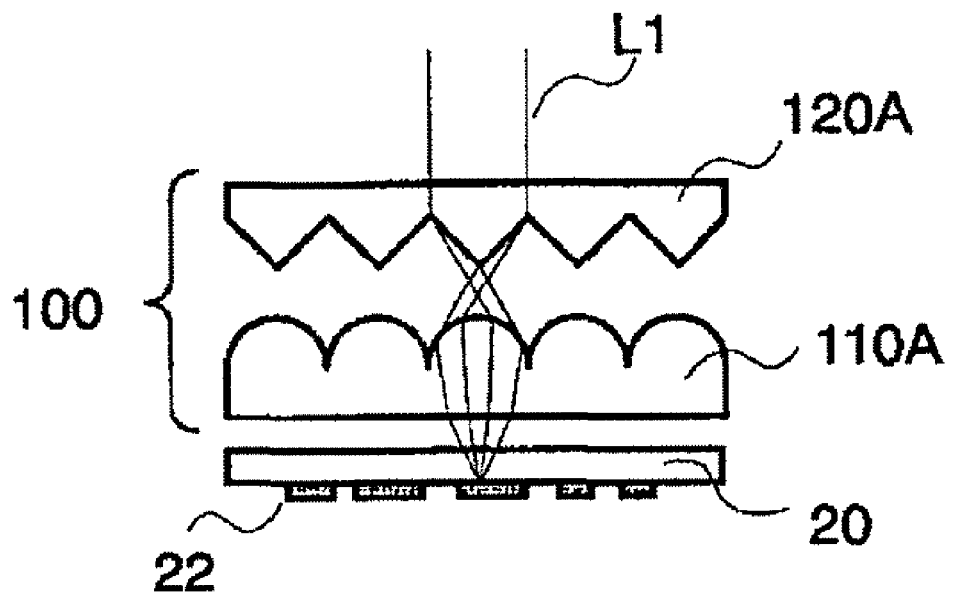
FIG. 7 is a schematic sectional view showing an illustrative structure of the condenser optical system in the exposure apparatus shown in FIG. 1.

The condenser optical system 100 may use an axicon lens 120A as shown in FIG. 7 for a member that makes the central part of each of the plural rays that illuminate the reticle darker than the periphery. FIG. 7 is a schematic sectional view showing a structure of the condenser optical system 100 that uses the axicon lens 120A.

Referring to FIG. 7, the axicon lens 120A splits the light L1 from the illumination apparatus 10 into plural rays, and each of the plural rays forms an annular luminance distribution, and is incident upon the microlens array 110A. The light condensed by the microlens array 110A illuminates the pattern 22 of the reticle 20.

The axicon lens 120A shown in FIG. 7 does not have to use a light blocking member, and can improve the use efficiency of the light from the illumination apparatus 10. Moreover, the axicon lens 120A shown in FIG. 7 can protects the optical system from the influence of the heat absorbed in and generated from the light blocking member.

Figure 8:
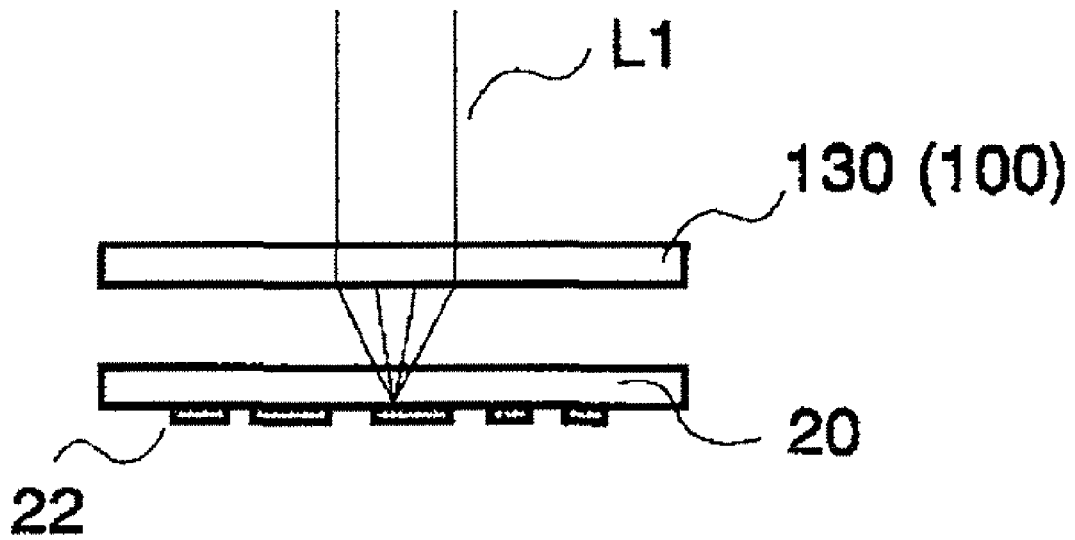
FIG. 8 is a schematic sectional view showing an illustrative structure of the condenser optical system in the exposure apparatus shown in FIG. 1.

The condenser optical system 100 may use a computer generated hologram ("CGH") as shown in FIG. 8. FIG. 8 is a schematic sectional view showing a structure of the condenser optical system 100 that uses the CGH 130. The CGH 130 is designed to split the light L1 from the illumination apparatus 10 into the plural rays L2, and to reduce a low frequency component in the spatial frequency (angular frequency) region of the plural rays L2. In other words, the CGH 130 serves as both the optical element 110 and the light attenuator 120.

Referring to FIG. 8, the light L1 incident upon the CGH 130 illuminates the pattern 22 of the reticle 20 while the low frequency component is reduced. The condenser optical system 100 shown in FIG. 8 does not need an alignment between the microlens array 110A and the light blocking member (optical element 120), and an alignment between the axicon lens 120A and the microlens array 110A, preventing an imaging deterioration due to alignment errors.

Figure 9:
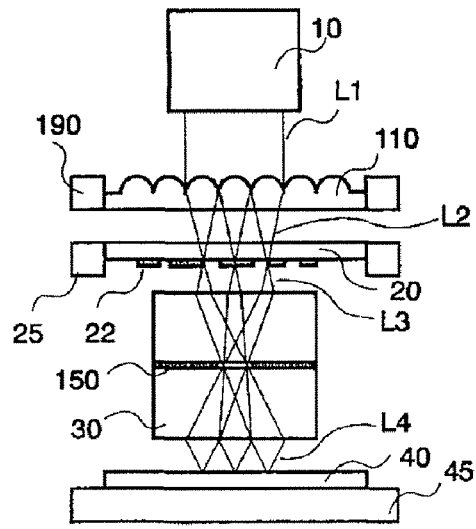
FIG. 9 is a schematic sectional view showing a structure of another exposure apparatus according to one aspect of the present invention.

As shown in FIG. 9, a pupil filter 150 that attenuates the low frequency component that would deteriorate the contrast of the image can provide a similar effect (or the effect of the above light attenuator 120) on the pupil plane of the projection optical system 30. FIG. 9 is a schematic sectional view showing a structure of an exposure apparatus 1A that uses the pupil filter 150.

Referring to FIG. 9, the light L1 from the illumination apparatus 10 is split into plural rays L2 by the optical element 110. The rays L2 become convergent light by the optical element 110, and are condensed on the surface on which the pattern 22 of the reticle 20 is formed, forming plural spots.

The pattern 22 on the reticle 20 absorbs or phase-modulates parts of the plural rays L2. The rays L3 that have transmitted the reticle 20 among the plural rays L2 are incident upon the projection optical system 30. The rays L3 that have transmitted the reticle 20 contain the diffracted light due to the pattern 22 of the reticle 20.

The pupil filter 150 arranged on the pupil plane of the projection optical system 30 shields the 0-th order diffracted light among the diffracted rays contained in the rays L3. The rays that have transmitted through the pupil filter 150 are refracted and/or reflected in the projection optical system 30, become plural convergent rays L4, and form plural beam spots on the wafer 40. The beam spots form the pattern 22 of the reticle 20 on the photosensitive material or thermally reactive material, such as a resist, applied to the wafer 40.

The pupil filter 150 is made of a material that shields the pupil center, for example, like the area DC1 shown in FIG. 3. The light shielding part of the pupil filter 150 may be equipped with a cooling mechanism, such as a water cooling mechanism and a Peltier element, so as to reduce the thermal influence due to the light absorption.

The exposure apparatus 1A thus reduces the OPE generated in the conventional exposure apparatus, and reduces the OPC pattern that would otherwise be added to the pattern 22 of the reticle 20. Moreover, in transferring the image of a small pattern size for the wavelength of the exposure light, the exposure apparatus 1A does not require a complicated OPC pattern to be added to a circuit pattern having a small k1 factor on a reticle, preventing the increased manufacturing cost and the reduced yield.

Figure 10:
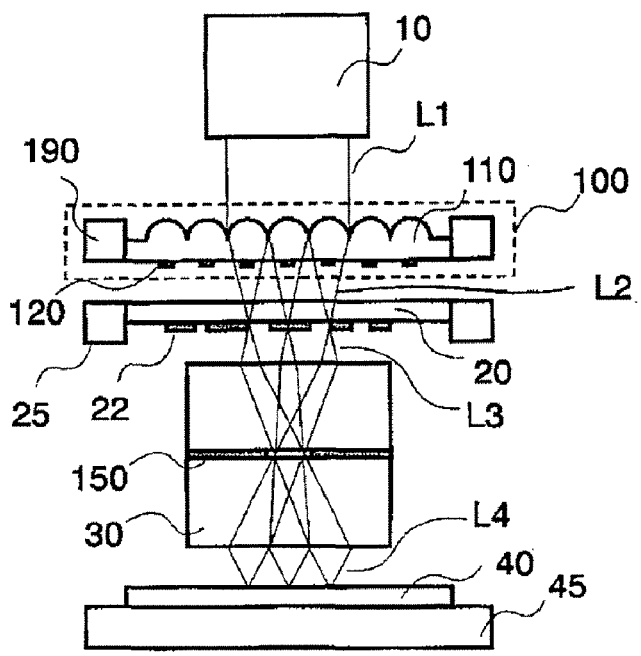
FIG. 10 is a schematic sectional view showing a structure of still another exposure apparatus according to one aspect of the present invention.

As shown in FIG. 10, use of a combination of the light attenuator 120 and the pupil filter 150 can improve the image fidelity (transfer accuracy). FIG. 10 is a schematic sectional view showing a structure of an exposure apparatus 1B that uses the combination of the light attenuator 120 and the pupil filter 150.

Referring to FIG. 10, the optical element 110 splits the light L1 from the illumination apparatus 10 is split into plural rays L2. The light attenuator 120 shields or attenuates the low frequency component of the spatial frequency (angular frequency) of the rays L2. The rays L2 whose low frequency components are shielded are condensed on the surface on which the pattern 22 of the reticle 20 is formed, forming plural spots.

The pattern 22 on the reticle 20 absorbs or phase-modulates parts of the plural rays L2. The rays L3 that have transmitted the reticle 20 among the plural rays L2 and have passed the area other than the pattern 22 are incident upon the projection optical system 30. The rays L3 that have transmitted the reticle 20 contain the diffracted light due to the pattern 22 of the reticle 20.

The pupil filter 150 arranged on the pupil plane of the projection optical system 30 shields the 0-th order diffracted light among the diffracted rays contained in the rays L3. The rays that have transmitted through the pupil filter 150 are refracted and/or reflected in the projection optical system 30, become plural convergent rays L4, and form plural beam spots on the wafer 40. The beam spots form the pattern 22 of the reticle 20 on the photosensitive material or thermally reactive material, such as a resist, applied to the wafer 40.

The pupil plane of the projection optical system 30 shields the low frequency component generated from manufacturing errors of the optical element 110 and the light attenuator 120 and the low frequency component generated from an aperture among the microlenses when the optical element 110 is the microlens array. Therefore, the exposure apparatus 1B can improve the contrast and fidelity (transfer accuracy) of the image transferred to the wafer 40.

The pupil filter 150 for the exposure apparatuses 1A and 1B may be a light blocking member made of metal or metal coated with an antireflection film when the projection optical system 30 is a normal dioptric system, thereby preventing unnecessary reflected light for the projection optical system 30, and providing a high light shielding characteristic.

Instead of the condenser optical system 100 of FIG. 10, the condenser optical systems 100 shown in FIG. 7 or 8 may provide similar effects.

Figure 11:
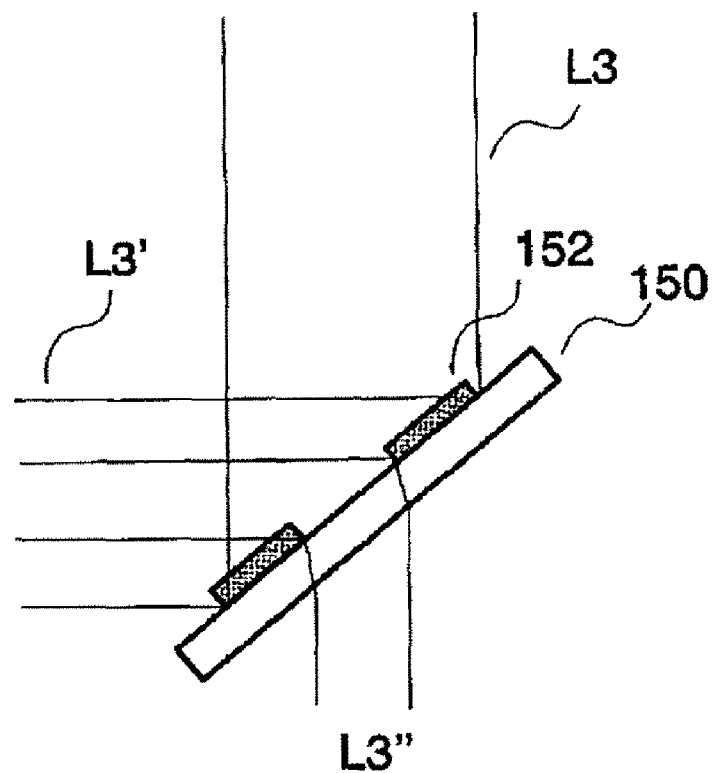
FIG. 11 is a schematic sectional view showing an illustrative structure of a pupil filter for the exposure apparatuses shown in FIGS. 9 and 10.

The pupil filter 150 may be catoptric or a reflection type. FIG. 11 is a schematic sectional view showing a structure (concept) of the catoptric pupil filter. Referring to FIG. 11, the rays L3 that have transmitted the reticle 20 are incident upon the pupil filter 150. Parts of the rays L3 are reflected on a reflection film 152, become reflected rays L3', and contribute to imaging on the wafer 40. The rays among the rays L2 which are not reflected on the reflection film 152 become transmitted rays L3'', and do not contribute to imaging on the wafer 40. This configuration reduces a heat absorption and a thermal deformation of the pupil filter 150, and lessens the influence on the surrounding optical system, maintaining the imaging quality of the entire projection optical system 30. While FIG. 11 images the reflected light L3' on the wafer 40, the reflection film 152 may be arranged at the center of the rays L3 so that the reflected rays L3' are not used for imaging on the wafer 40, and transmitted rays L3'' can be imaged on the wafer 40.

The reticle used for the conventional exposure apparatus has a pattern on the reticle substrate on the side of the projection optical system so as to reduce or eliminate the aberration caused by the reticle substrate in the reticle. In other words, the reticle is arranged so that the patterned surface can face the projection optical system.

Figure 12:
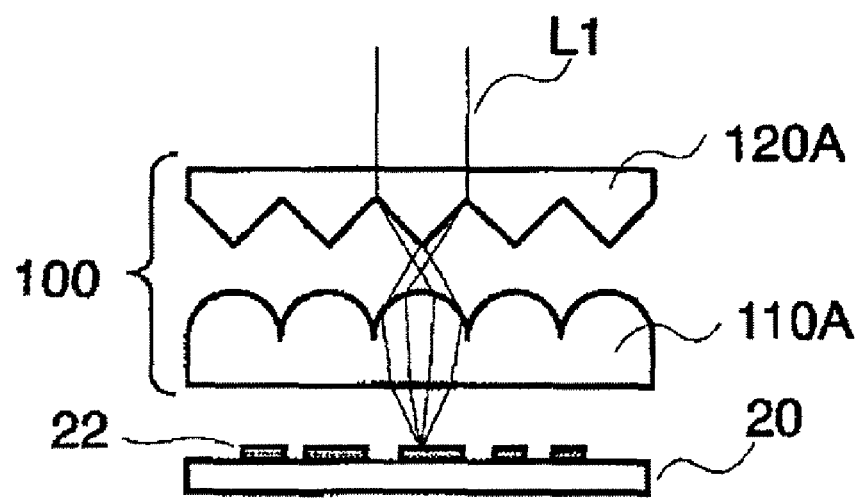
FIG. 12 is a view for explaining an illustrative arrangement of a reticle in the exposure apparatus shown in FIG. 1.

On the other hand, the exposure apparatus of this embodiment may arrange the reticle 20 so that the surface having the pattern 22 faces the illumination apparatus 10, for example, as shown in FIG. 12. Referring to FIG. 12, the light L1 is turned into the light having an annular luminous distribution by the axicon lens 120A, and incident upon the microlens array 110A. The microlens array 110A condenses the light L1 on the surface of the reticle 20 which has the pattern 22. This configuration can shorten a focal length of the microlens array 110A and the spot diameter, and narrows the intervals among the microlenses 112A of the microlens array 110A. Thus, this configuration can increase the density of the microlenses 112A, and the number of spots used to simultaneously illuminate the pattern 22 of the reticle 20. This configuration can increase a transferring speed to the wafer 40 for the pattern 22 of the reticle 20, and improve the throughput of the exposure apparatus. Here, FIG. 12 is a view for explaining an arrangement of the reticle 20.

In accordance with the pattern 22 of the reticle 20, the optical element 110, such as the microlens array 110A, may make variable the incident angle distribution and the illumination intensity distribution of the rays L2 that illuminate the pattern 22 of the reticle 20. In other words, parts of the split rays L2 may be optionally used. For example, the incident angle distribution of the light used to illuminate the reticle 20 is adjusted to improve the light use efficiency so that only the high frequency component may be used for a fine pattern 22, and both the high frequency component and the low frequency component may be used to illuminate the rough pattern 22.

In addition, the optical element 110 may attenuate the dose of the light incident upon the reticle 20 for parts corresponding to the pattern (light shielding part) 22 of the reticle 20, and increase the dose of the light incident upon the reticle 20 for the vicinity of the edge of the pattern 22 and the transmitting part. Thereby, the dose of the light absorbed in the pattern 22 of the reticle 20 reduces, lowering a deformation of the reticle 20 caused by the heat generated in the pattern 22, and the influence on the surrounding optical system. In addition, this configuration improves the durability of the reticle 20, and reduces the cost of the reticle 20.

Figure 13:
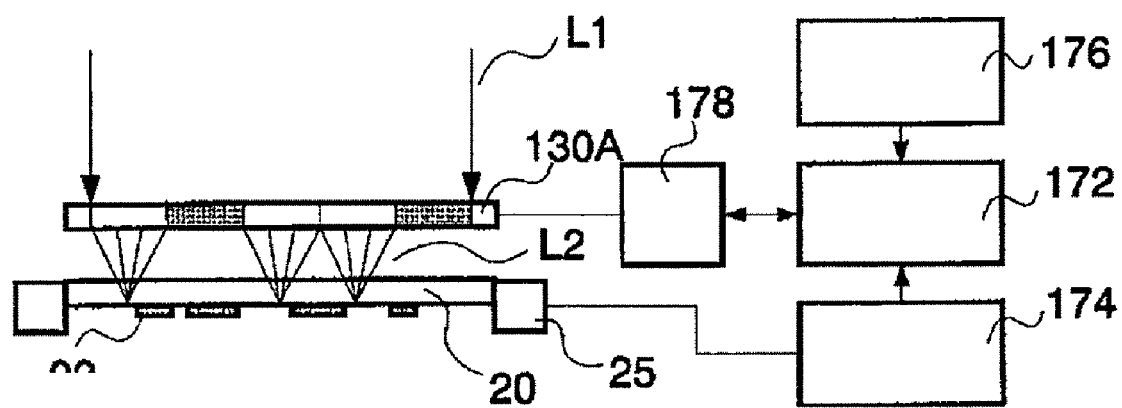
FIG. 13 is a schematic sectional view showing a structure of the condenser optical system that uses a computer generated hologram ("CGH") in the exposure apparatus shown in FIG. 1.

FIG. 13 is a schematic sectional view showing a structure that uses a CGH 130A for the condenser optical system 100. The CGH 130A is a CGH that can adjust the transmitting dose using the liquid crystal. A signal processor 172 finds a positional relationship between the CGH 130A and the pattern 22 based on the positional information of the reticle 20 from a controller 174 that controls driving of the reticle stage 25 and the pattern information from a memory 176 that stores the pattern 22 of the reticle 20. The signal processor 172 refers to the pattern 22 of the reticle 20 corresponding to the position of the CGH 130A, and sends arrangement data of the transmitting part and the shielding part of the CGH 130A to an adjuster 178. The adjuster 178 adjusts a light transmitting pattern of the CGH 130A based on the arrangement data from the signal processor 172.

An adjusting mechanism that adjusts the incident angle distribution and the illumination intensity distribution used to illuminate the pattern 22 of the reticle 20 is not limited to the CGH 130A that utilizes the liquid crystal. For instance, the adjusting mechanism can use a micro electro mechanical system ("MEMS") switch, an optical switch that utilizes a mechanical shutter and the liquid crystal, and a zooming mechanism of the axicon lens.

While the exposure apparatus of this embodiment illuminates the pattern 22 of the reticle 20 using plural rays, the plural rays may have a low degree of coherence. Therefore, the number of light sources is not be limited to one unlike the conventional exposure apparatus. For example, when the rays from plural light sources are incident upon different positions on the optical element 110, such as each microlens 112A of the microlens array 110A, both the degree of coherence of the light and the OPE lower. In addition, use of plural small solid lasers can make the entire exposure apparatus smaller and the running cost lower than use of the excimer laser.

In exposure, the light emitted from the illumination apparatus 10 illuminates the reticle 20 via the condenser optical system 110. The light that has passed the reticle 20 and reflects the reticle pattern is imaged on the wafer 40 via the projection optical system 30. The exposure apparatuses 1 to 1B illuminate the reticle 20 with plural rays, and the light blocking member 120 and/or the projection optical system 30 (pupil filter 150) blocks and/or attenuates a low frequency component of the light that reflects the reticle pattern. Thereby, the exposure apparatuses 1 to 1B can provide higher quality devices, such as a semiconductor device and a liquid crystal display, than ever with a high throughput and a good economical efficiency.

Figure 14:
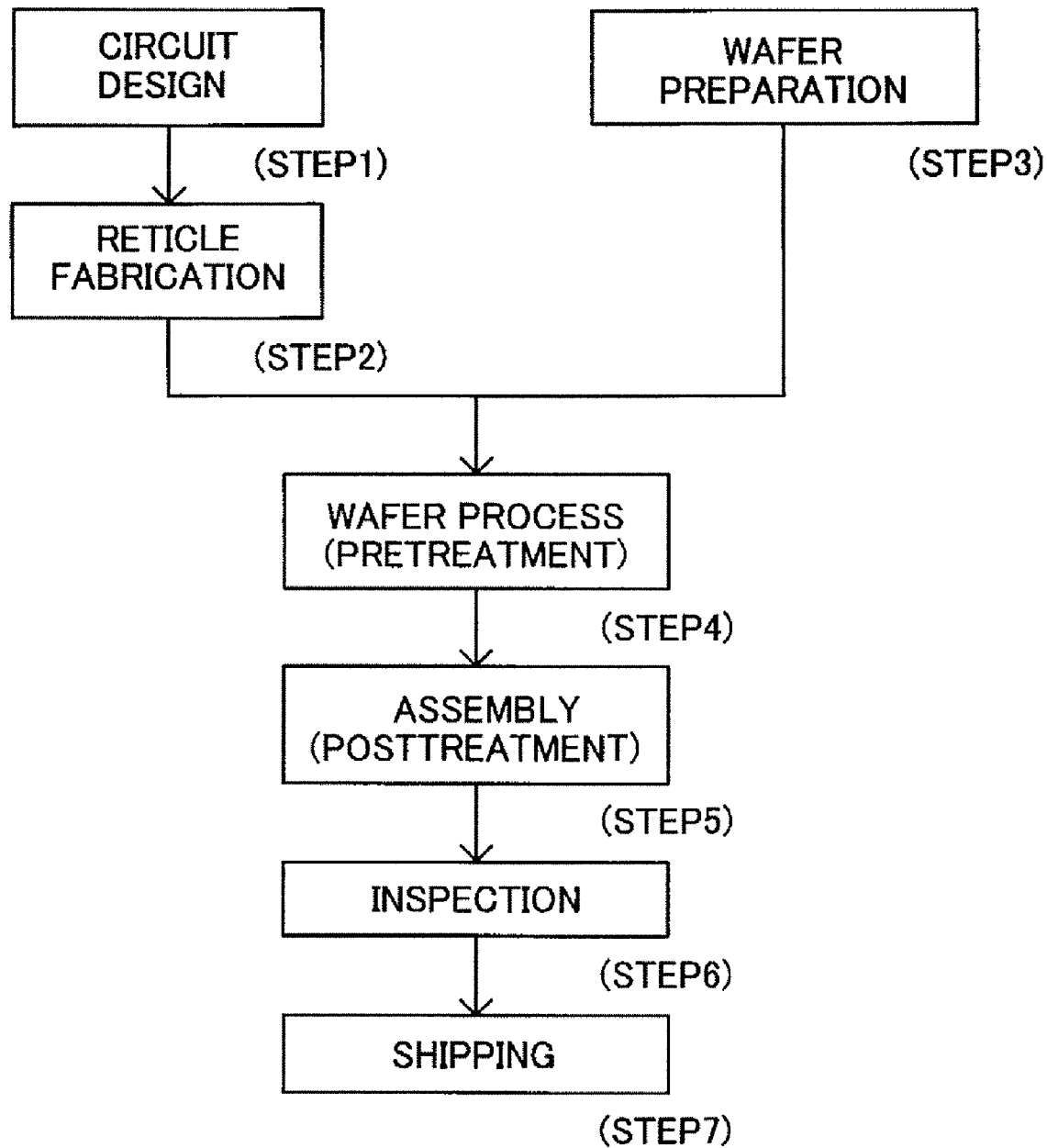
FIG. 14 is a flowchart for explaining a fabrication of a device.
Figure 15:
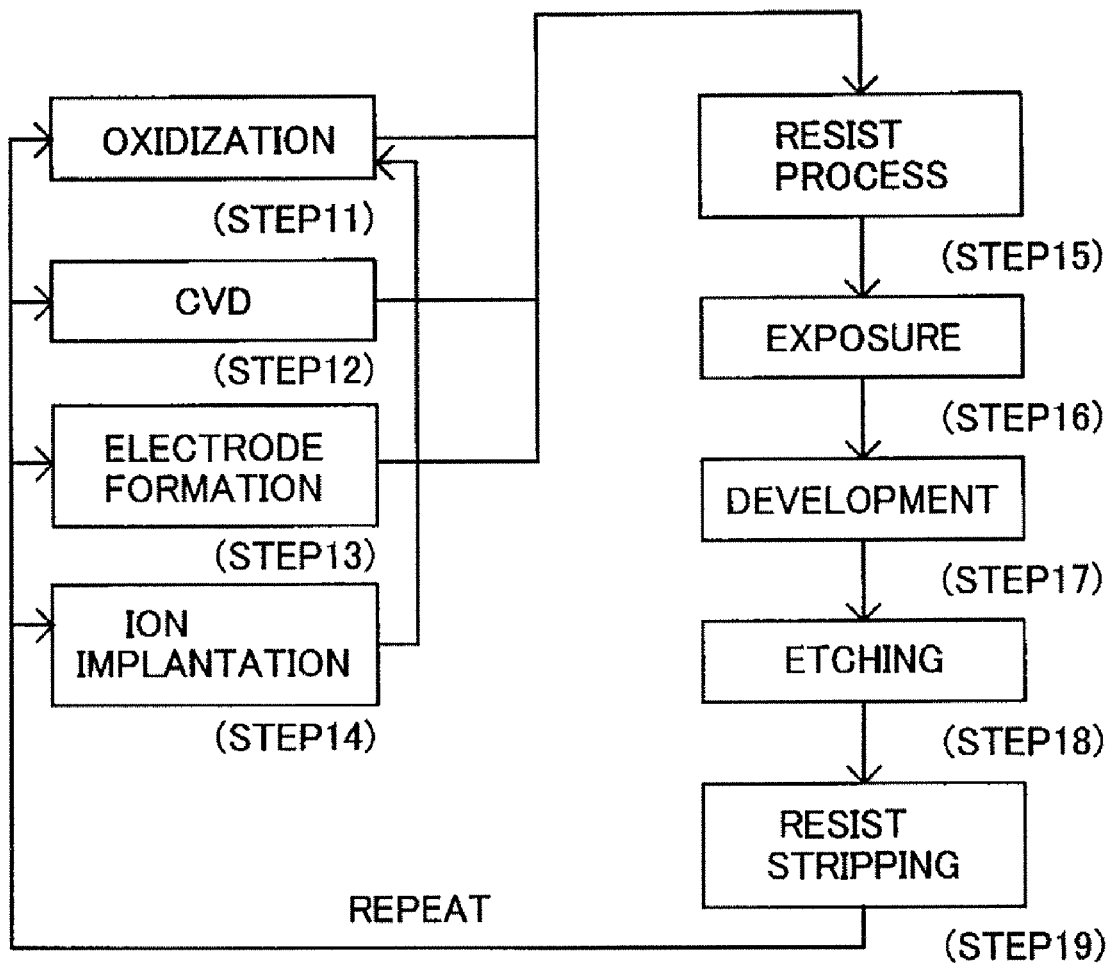
FIG. 15 is a flowchart for a wafer process of step 4 shown in FIG. 14.

Referring now to FIGS. 14 and 15, a description will be given of an embodiment of a device manufacturing method using one of the above exposure apparatuses 1 to 1B. FIG. 14 is a flowchart for explaining manufacture of devices, such as a semiconductor device and a liquid crystal display device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses one of the exposure apparatuses 1 to 1B to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device manufacturing method using the exposure apparatus 1, and a resultant device also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-127773, filed on May 1, 2006, which is hereby incorporated by reference herein in its entirety.

What is claimed is:

1. An exposure apparatus that exposes a pattern of an original onto a substrate, said exposure apparatus comprising:
    a microlens array configured to split light from a light source into plural rays, and to condense each of the plural rays at positions different from each other on the original so as to form plural spots;
    a projection optical system configured to project the pattern of the original onto the substrate by projecting the plural rays on the substrate; and
    a light attenuator configured to make the central part of each of the plural rays that illuminate the original darker than the periphery,
    wherein each of the plural rays which have been emitted from the microlens array has a light intensity distribution in which a central part is darker than a periphery,
    wherein the microlens array has a convex shape in a surface of a light source side of the microlens array,
    wherein the pattern of the original is formed on a surface of a light source side of the original, and
    wherein the light attenuator is formed on a surface of an original side of the microlens array.

2. An exposure apparatus according to claim 1, further comprising a pupil filter that is arranged on a pupil plane in the projection optical system, and makes a central part of the pupil plane darker than a periphery of the pupil plane.

3. An exposure apparatus according to claim 1, further comprising an adjuster configured to adjust, based on the pattern of the original, an incident angle distribution of the plural rays that illuminate the original.

4. A device manufacturing method comprising the steps of:
    exposing a substrate using an exposure apparatus according to claim 1; and
    developing the substrate that has been exposed.

5. A scanning exposure apparatus that exposes a pattern of an original onto a substrate by scanning the original and the substrate relative to each other in a scan direction, said exposure apparatus comprising:
- a microlens array configured to split light from a light source into plural rays, and to condense each of the plural rays at positions different from each other on the original so as to form plural spots;
- a projection optical system configured to project the pattern of the original onto the substrate by projecting the plural rays on the substrate, and
- a light attenuator configured to make the central part of each of the plural rays that illuminate the original darker than the periphery,
- wherein each of the plural rays which have been emitted from the microlens array has a light intensity distribution in which a central part is darker than a periphery,
- wherein the microlens array has a convex shape in a surface of a light source side of the microlens array,
- wherein the pattern of the original is formed on a surface of a light source side of the original,
- wherein the light attenuator is formed on a surface of an original side of the microlens array, and
- wherein the microlens array includes plural rows of microlenses for condensing the plural rays onto different positions of the original, each row inclining to a direction orthogonal to the scan direction.

6. An exposure apparatus that exposes a pattern of an original onto a substrate, said exposure apparatus comprising:
- a microlens array configured to split light from a light source into plural rays, and to condense each of the plural rays at positions different from each other on the original so as to form plural spots; and
- a projection optical system configured to project the pattern of the original onto the substrate by projecting the plural rays on the substrate,
- wherein each of the plural rays which have been emitted from the microlens array has a light intensity distribution in which a central part is darker than a periphery,
- wherein each lens of the microlens array has a convex surface in a light source side and a flat surface on an original side, and
- wherein a light attenuator, which is configured to make the central part of at least one of the plural rays that illuminates the original darker than the periphery, is formed on the flat surface.

* * * * *